(12) United States Patent
Liu et al.

(10) Patent No.: US 9,182,446 B2
(45) Date of Patent: Nov. 10, 2015

(54) RELAY DETECTION APPARATUS AND METHOD OF OPERATING THE SAME

(71) Applicant: DELTA ELECTRONICS, INC., Taoyuan County (TW)

(72) Inventors: Xin-Wei Liu, Taoyuan County (TW); Tsung-Yuan Wu, Taoyuan County (TW)

(73) Assignee: DELTA ELECTRONICS, INC. (TW)

( * ) Notice: Subject to any disclaimer, the term of this patent is extended or adjusted under 35 U.S.C. 154(b) by 172 days.

(21) Appl. No.: 14/058,613

(22) Filed: Oct. 21, 2013

(65) Prior Publication Data

US 2014/0333311 A1 Nov. 13, 2014

(30) Foreign Application Priority Data

May 10, 2013 (CN) .......................... 2013 1 0173258

(51) Int. Cl.
*G01R 31/02* (2006.01)
*G01R 31/327* (2006.01)
*G01R 19/00* (2006.01)

(52) U.S. Cl.
CPC .......... *G01R 31/327* (2013.01); *G01R 19/0038* (2013.01)

(58) Field of Classification Search
CPC ....................................................... G01R 31/327
USPC .................................................. 324/418–424
See application file for complete search history.

(56) References Cited

U.S. PATENT DOCUMENTS 4,516,076 A * 5/1985 Pillari et al. .................. 324/418
5,428,294 A * 6/1995 Teel, Jr. ......................... 324/418

* cited by examiner

*Primary Examiner* — Vincent Q Nguyen
(74) *Attorney, Agent, or Firm* — Hauptman Ham, LLP

(57) ABSTRACT

A relay detection apparatus includes at least one relay, a voltage detection module, and a voltage comparison unit. The relay has an input contact, an output normally-open contact, and an output normally-close contact. The voltage detection module has a first voltage detection unit and a second voltage detection unit. The first voltage detection unit receives a voltage of the input contact and produces a first output voltage. The second voltage detection unit receives a voltage of the output normally-close contact and produces a second output voltage. The voltage comparison unit receives the first output voltage and the second output voltage and then compares the two voltages, thus detecting normal and/or abnormal contact statuses of the input contact, the output normally-open contact, and the output normally-close contact of the relay.

17 Claims, 12 Drawing Sheets

RELAY DETECTION APPARATUS AND METHOD OF OPERATING THE SAME

BACKGROUND

1. Technical Field

The present disclosure relates generally to a relay detection apparatus and a method of operating the same, and more particularly to a relay detection apparatus and a method of operating the same which are provided to detect contact statues of relay(s) thereof.

2. Description of Related Art

Because relays have features of small size and simple control, relays are widely applied to power electronic products. Also, size and electrical specifications of relay contacts would be limited because of the small-size relay so that relay contacts have poor ability to work against inrush current.

The issue of inrush current of relays in the power electronic application is significant, that is, the greater inrush current easily causes the contact sticking, especially for the mechanical relay. Especially, the contact bounce is likely to occur when the mechanical relay is operated under the greater inrush current condition. Accordingly, the contact bounce is to cause operation malfunction, use life reduction, and even personal safety threat. In addition, due to the limitation of the relay size, most relays cannot provide the function of showing abnormal or normal contact statuses.

With the development of hybrid electric vehicles and electric vehicles, the demands of chargers for mobile vehicles are increased so that relays are more used in the charger products. Because the numbers of switching relay contacts in the chargers are frequent, the requirements of against inrush current and against contact sticking are strict. Accordingly, it is more important to detect the open/close and normal/abnormal contact statuses so as to ensure personal safety.

Accordingly, it is desirable to provide a relay detection apparatus and a method of operating the same so that the relay detection apparatus can be widely applied to different circuits in the single-phase (1Φ) AC power system and three-phase (3Φ) AC power system. In addition, the normal and/or abnormal contact statuses of the contacts of the relay can be detected out by simply detecting voltage at the contacts so that once the abnormal contact status of the contacts of the relay is detected out, the relay is interruptedly used to ensure safety of operators.

SUMMARY

An object of the present disclosure is to provide a relay detection apparatus to solve the above-mentioned problems. Accordingly, the relay detection apparatus is operated in a single-phase AC power source and the relay detection apparatus includes at least one relay, a voltage detection module, and a voltage comparison unit. The at least one relay includes an input contact, an output normally-open contact, and an output normally-close contact. The voltage detection module includes a first voltage detection unit and a second voltage detection unit. The first voltage detection unit is configured to receive a voltage at the input contact and produce a first output voltage. The second voltage detection unit is configured to receive a voltage at the output normally-close contact and produce a second output voltage. The voltage comparison unit is configured to receive the first output voltage and the second output voltage and compare the first output voltage and the second output voltage so that normal and/or abnormal contact statuses of the input contact, the output normally-open contact, and the output normally-close contact of the relay are detected out.

Another object of the present disclosure is to provide a relay detection apparatus to solve the above-mentioned problems. Accordingly, the relay detection apparatus is operated in a three-phase AC power source and the relay detection apparatus includes at least one relay, at least one voltage detection module, and at least one voltage comparison unit. The at least one relay includes an input contact, an output normally-open contact, and an output normally-close contact. The at least one voltage detection module includes a first voltage detection unit and a second voltage detection unit. The first voltage detection unit is configured to receive a voltage at the input contact and produce a first output voltage. The second voltage detection unit is configured to receive a voltage at the output normally-close contact and produce a second output voltage. The at least one voltage comparison unit is configured to receive the first output voltage and the second output voltage and compare the first output voltage and the second output voltage so that normal and/or abnormal contact statuses of the input contact, the output normally-open contact, and the output normally-close contact of the relay are detected out.

Further another object of the present disclosure is to provide a method of operating a relay detection apparatus to solve the above-mentioned problems. Accordingly, the method includes following steps: (a) providing at least one relay, each relay has an input contact, an output normally-open contact, and an output normally-close contact; (b) providing at least one voltage detection module; each voltage detection module has a first voltage detection unit and a second voltage detection unit; the first voltage detection unit is configured to receive a voltage at the input contact to be a first detection voltage and produce a first output voltage; the second voltage detection unit is configured to receive a voltage at the output normally-close contact to be a second detection voltage and produce a second output voltage; (c) providing at least one voltage comparison unit; the voltage comparison unit is configured to receive the first output voltage and the second output voltage and compare the first output voltage and the second output voltage so that normal and/or abnormal contact statuses of the input contact, the output normally-open contact, and the output normally-close contact of the relay are detected out.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The features of the present disclosure believed to be novel are set forth with particularity in the appended claims. The present disclosure itself, however, may be best understood by reference to the following detailed description of the present disclosure, which describes an exemplary embodiment of the present disclosure, taken in conjunction with the accompanying drawings, in which:

DETAILED DESCRIPTION

Figure 1:
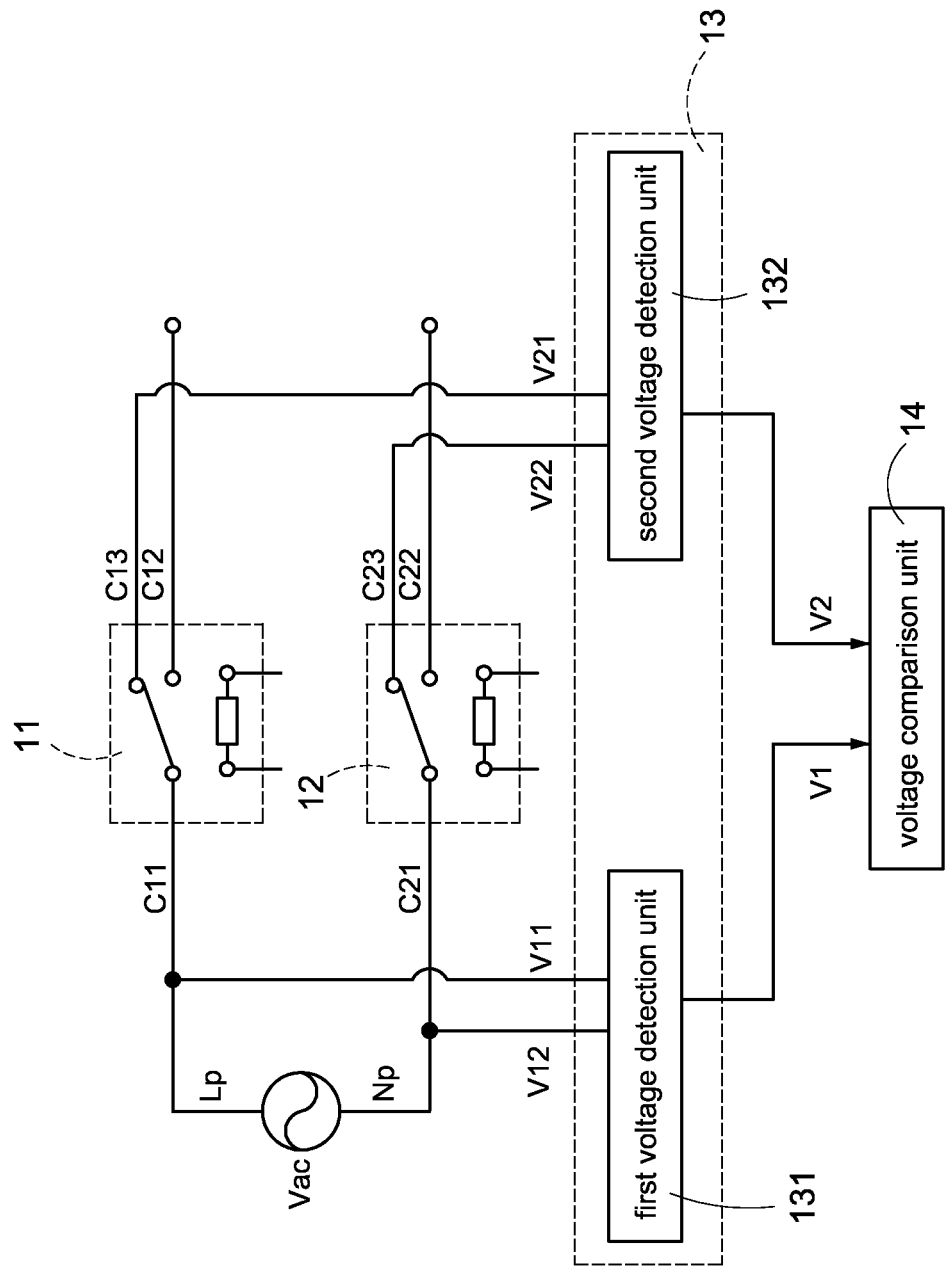
FIG. 1 is a schematic block diagram of a relay detection apparatus according to a first embodiment of the present disclosure.

Reference will now be made to the drawing figures to describe the present invention in detail.

Reference is made to FIG. 1 which is a schematic block diagram of a relay detection apparatus according to a first embodiment of the present disclosure. The relay detection apparatus is operated in a single-phase (1Φ) AC power system. The single-phase (1Φ) AC power system has a line path Lp and a ground path Np, and provides an AC power source Vac. It is assumed that the relay detection apparatus provides two relays, namely, a first relay 11 and a second relay 12. The first relay 11 is connected to the line path Lp and the second relay 12 is connected to the ground path Np.

The first relay 11 has a first contact C11, a second contact C12, and a third contact C13. The second relay 12 has a first contact C21, a second contact C22, and a third contact C23. It is assumed that a status between the first contact C11 and the second contact C12 of the first relay 11 is normally open; a status between the first contact C11 and third contact C13 of the first relay 11 is normally close. In addition, a status between the first contact C21 and the second contact C22 of the second relay 12 is normally open; a status between the first contact C21 and the third contact C23 of the second relay 12 is normally close. The line path Lp near the AC power source Vac is connected to the first contact C11 of the first relay 11, and the line path Lp away the AC power source Vac is connected to the second contact C12 of the first relay 11. The ground path Np near the AC power source Vac is connected to the first contact C21 of the second relay 12, and the ground path Np away the AC power source Vac is connected to the second contact C22 of the second relay 12.

It is assumed that the relay detection apparatus provides a voltage detection module 13, and the voltage detection module 13 has a first voltage detection unit 131 and a second voltage detection unit 132. The first voltage detection unit 131 is connected to the line path Lp and the first contact C11 of the first relay 11 to receive a first detection voltage V11, and also connected to the ground path Np and the first contact C21 of the second relay 12 to receive a second detection voltage V12. The second voltage detection unit 132 is connected to the third contact C13 of the first relay 11 to receive a first detection voltage V21, and also connected to the third contact C23 of the second relay 12 to receive a second detection voltage V22. The first voltage detection unit 131 receives the first detection voltage V11 and the second detection voltage V12 to produce a first output voltage V1; the second voltage detection unit 132 receives the first detection voltage V21 and the second detection voltage V22 to produce a second output voltage V2.

The voltage comparison unit 14 receives the first output voltage V1 and the second output voltage V2 to detect contact statuses of the first relay 11 and the second relay 12 according to the relationship between the first output voltage V1 and the second output voltage V2. That is, the first contact C11 and the second contact C12 of the first relay 11 are whether stuck together or not (the contact status between the first contact C11 and the second contact C12 of the first relay 11 is normally open), also the first contact C21 and the second contact C22 of the second relay 12 are whether stuck together or not (the contact status between the first contact C21 and the second contact C22 of the second relay 12 is normally open).

Figure 2:
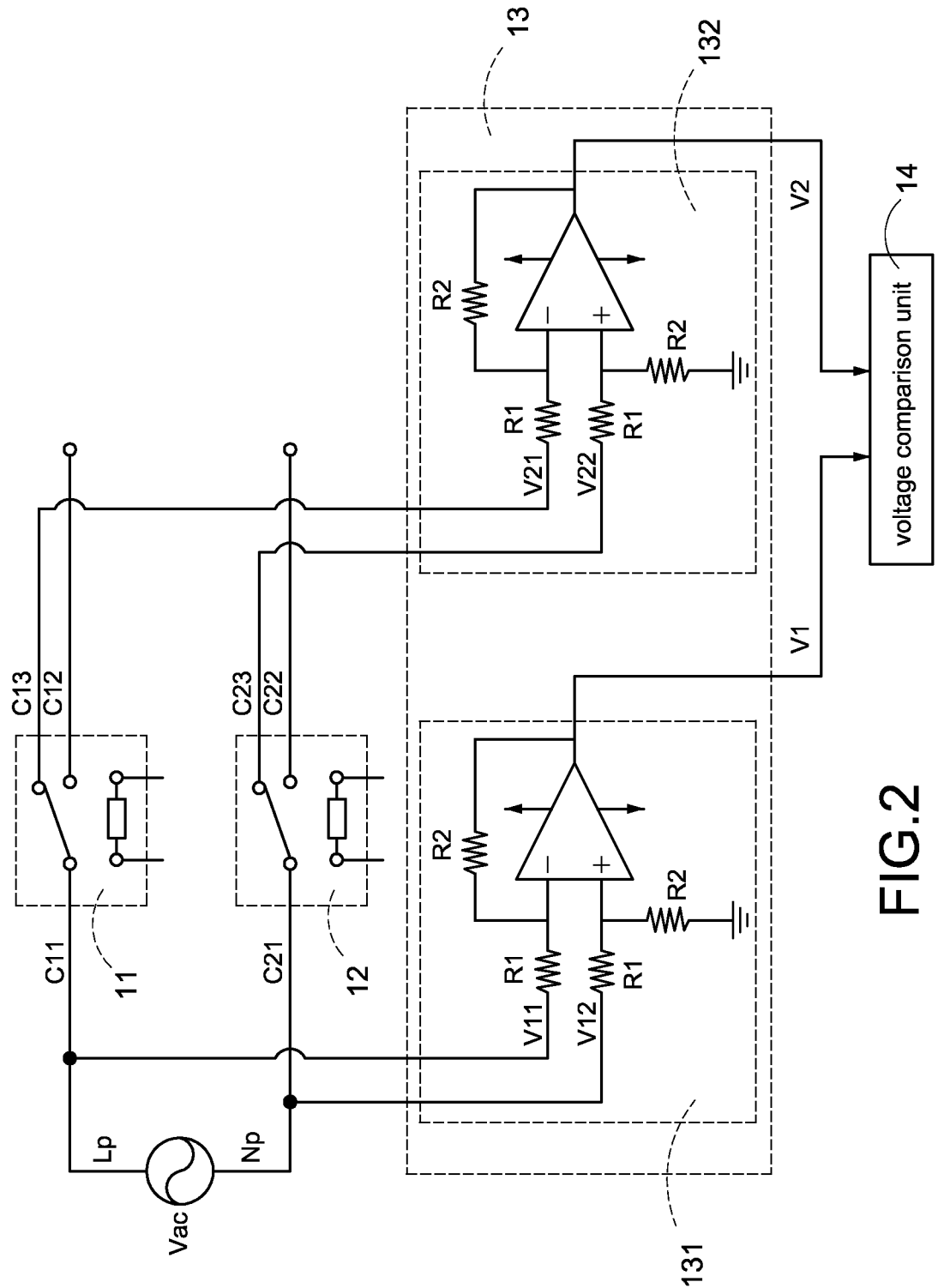
FIG. 2 is a circuit diagram of a voltage detection module of the relay detection apparatus according to a first embodiment of the present disclosure.

Reference is made to FIG. 2 which is a circuit diagram of a voltage detection module of the relay detection apparatus according to a first embodiment of the present disclosure. The first voltage detection unit 131 and the second voltage detection unit 132 are a differential amplifier, respectively. Each differential amplifier is composed of an operational amplifier (not labeled), two first resistors R1, and two second resistors R2. For the first voltage detection unit 131, the two first resistors R1 are connected to an inverting input terminal and a non-inverting input terminal of the operational amplifier to receive the first detection voltage V11 and the second detection voltage V12, respectively. One second resistor R2 is connected between the inverting input terminal and an output terminal of the operational amplifier, and the other second resistor R2 is connected between the non-inverting input terminal of the operational amplifier and a ground. Accordingly, the circuit structure of the differential amplifier is formed as mentioned above. In particular, the first output voltage V1 of the differential amplifier is equal to $(V12-V11) \times (R2/R1)$. Similarly, for the second voltage detection unit 132, the two first resistors R1 are connected to an inverting input terminal and a non-inverting input terminal of the operational amplifier to receive the first detection voltage V21 and the second detection voltage V22. One second resistor R2 is connected between the inverting input terminal and an output terminal of the operational amplifier, and the other second resistor R2 is connected between the non-inverting input terminal of the operational amplifier and a ground. Accordingly, the circuit structure of the differential amplifier is formed as mentioned above. In particular, the second output voltage V2 of the differential amplifier is equal to $(V22-V21) \times (R2/R1)$.

When contact statuses of the first relay 11 and the second relay 12 are normal, as shown in FIG. 2, the first voltage detection unit 131 receives the first detection voltage V11 and the second detection voltage V12, and amplifies a voltage difference between the first detection voltage V11 and the second detection voltage V12 to produce the first output voltage V1. Similarly, the second voltage detection unit 132 receives the first detection voltage V21 and the second detection voltage V22, and amplifies a voltage difference between the first detection voltage V21 and the second detection voltage V22 to produce the second output voltage V2. At this time, the first detection voltage V11 is equal to the first detection voltage V21 and the second detection voltage V12 is equal to the second detection voltage V22. If a ratio between the second resistor R2 and the first resistor R1 of the first voltage detection unit 131 is equal to a ratio between the second resistor R2 and the first resistor R1 of the second voltage detection unit 132, the first output voltage V1 outputted from the first voltage detection unit 131 is equal to the second output voltage V2 outputted from the second voltage detection unit 132. Accordingly, the normal contact statuses of the first relay 11 and the second relay 12 can be detected out when the voltage comparison unit 14 compares that the first output voltage V1 is equal to the second output voltage V2.

In addition, when the first contact C11 and the second contact C12 of the first relay 11 are closed and the first contact C21 and the second contact C22 of the second relay 12 are closed, the first relay 11 and the second relay 12 are operated under a normal power supply as similarly shown in FIG. 2. Because a voltage difference between the first detection voltage V21 and the second detection voltage V22 is zero, the second output voltage V2 produced from the second voltage detection unit 132 is zero. Accordingly, the normal contact statuses of the first relay 11 and the second relay 12 can be detected out when the voltage comparison unit 14 compares that the second output voltage V2 is equal to zero.

Figure 3A:
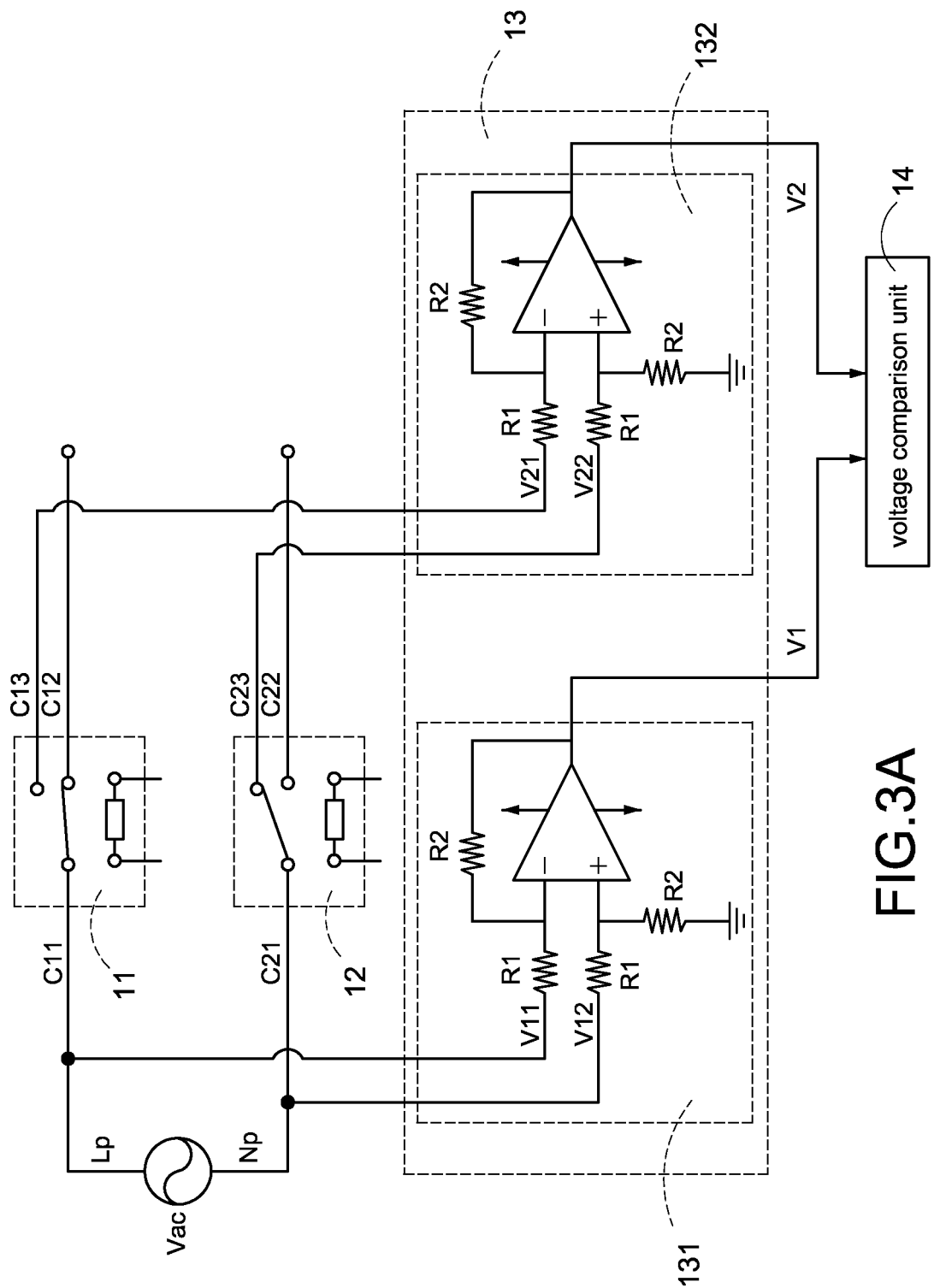
FIG. 3A is a schematic circuit diagram of showing contact sticking in the first relay according to the present disclosure.

On the contrary, when contact statuses of the first relay 11 are abnormal, such as the first contact C11 and the second contact C12 of the first relay 11 are stuck together (the contact status between the first contact C11 and the second contact C12 of the first relay 11 is normally open), as shown in FIG. 3A, the first detection voltage V11 is not equal to the first detection voltage V21 but the second detection voltage V12 is equal to the second detection voltage V22. Hence, the first output voltage V1 outputted from the first voltage detection unit 131 is not equal to the second output voltage V2 outputted from the second voltage detection unit 132. Accordingly, the abnormal contact statuses of the first relay 11 or the second relay 12 can be detected out, that is, one of the first relay 11 and the second relay 12 occurs contact sticking when the voltage comparison unit 14 compares that the first output voltage V1 is not equal to the second output voltage V2.

Figure 3B:
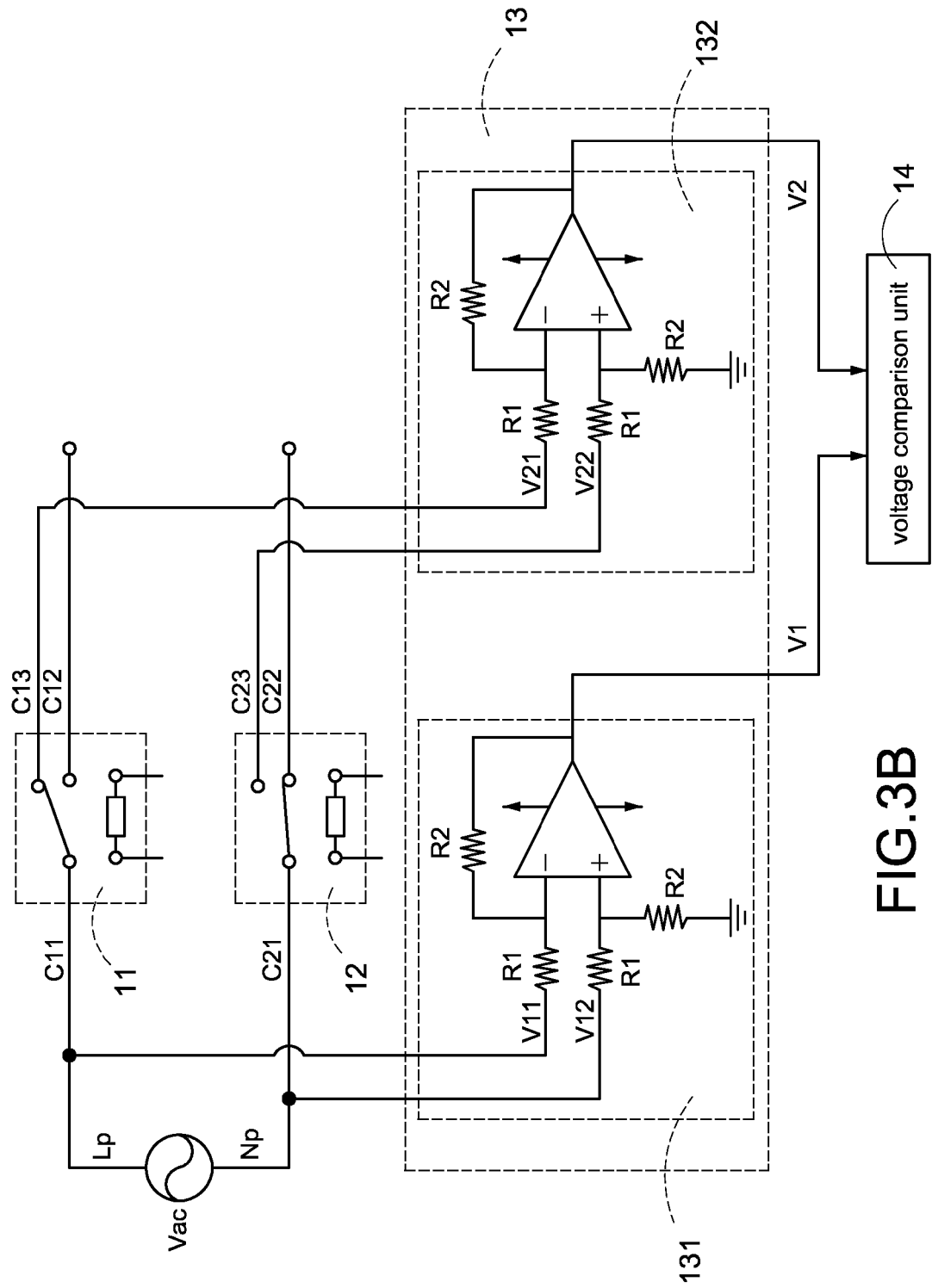
FIG. 3B is a schematic circuit diagram of showing contact sticking in the second relay according to the present disclosure.

Similarly, when contact statuses of the second relay 12 are abnormal, such as the first contact C21 and the second contact C22 of the second relay 12 are stuck together (the contact status between the first contact C21 and the second contact C22 of the second relay 12 is normally open), as shown in FIG. 3B, the first detection voltage V11 is equal to the first detection voltage V21 but the second detection voltage V12 is not equal to the second detection voltage V22. Hence, the first output voltage V1 outputted from the first voltage detection unit 131 is not equal to the second output voltage V2 outputted from the second voltage detection unit 132. Accordingly, the abnormal contact statuses of the first relay 11 and the second relay 12 can be detected out, that is, one of the first relay 11 and the second relay 12 occurs contact sticking when the voltage comparison unit 14 compares that the first output voltage V1 is not equal to the second output voltage V2.

Figure 4:
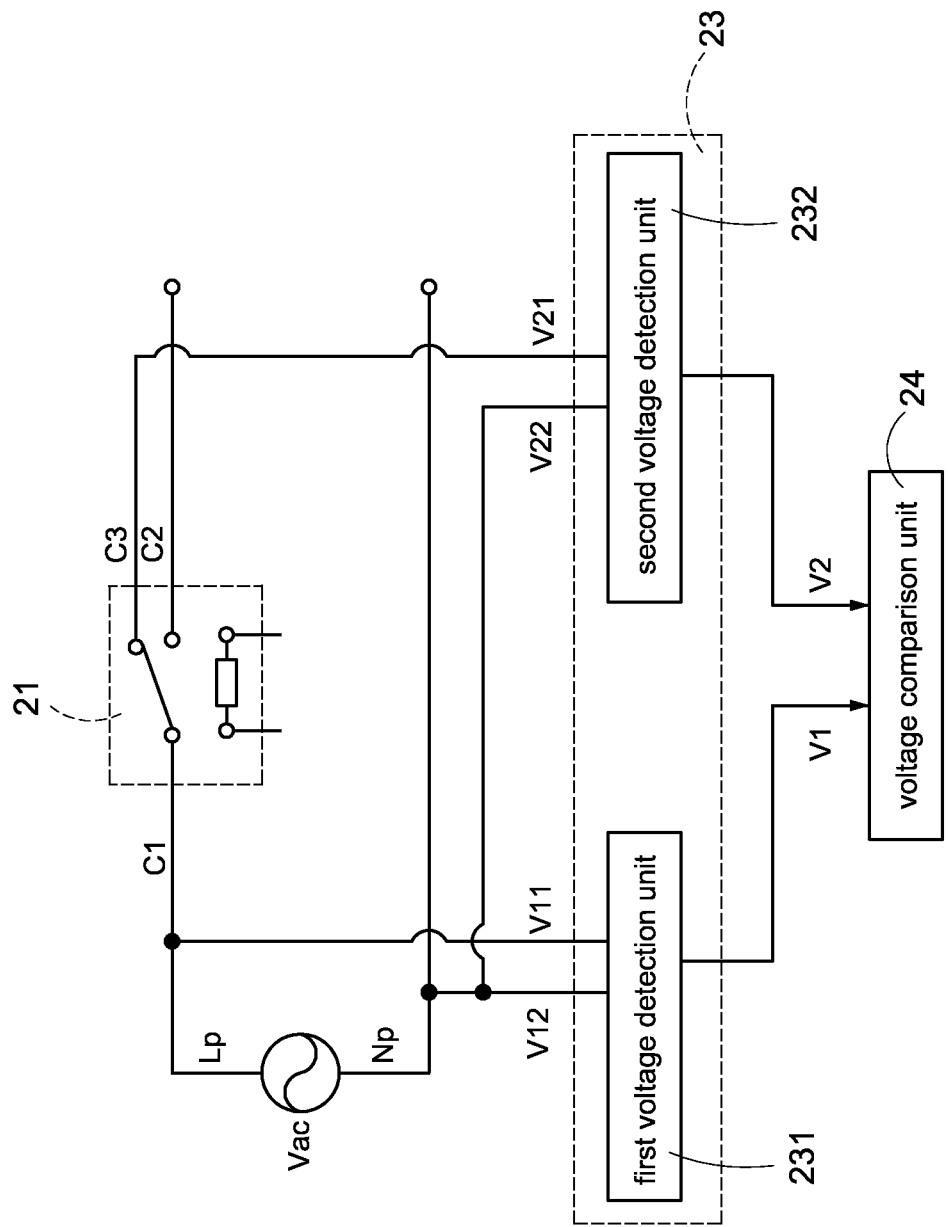
FIG. 4 is a schematic block diagram of the relay detection apparatus according to a second embodiment of the present disclosure.

Reference is made to FIG. 4 which is a schematic block diagram of the relay detection apparatus according to a second embodiment of the present disclosure. Comparing to the first embodiment as shown in FIG. 1, the relay detection apparatus is also operated in a single-phase (1Φ) AC power system. In this embodiment, however, the relay detection apparatus provides only one relay 21, and the relay 21 is connected to the line path Lp. Also, it is assumed that the relay detection apparatus provides a voltage detection module 23, and the voltage detection module 23 has a first voltage detection unit 231 and a second voltage detection unit 232.

The first voltage detection unit 231 is connected to the line path Lp and a first contact C1 of the relay 21 to receive a first detection voltage V11, and also connected to the ground path Np receive a second detection voltage V12. The second voltage detection unit 232 is connected to a third contact C3 of the relay 21 to receive a first detection voltage V21, and also connected to the ground path Np to receive a second detection voltage V22. In particular, the second detection voltage V12 is equal to the second detection voltage V22. The first voltage detection unit 231 receives the first detection voltage V11 and the second detection voltage V12 to produce a first output voltage V1; the second voltage detection unit 232 receives the first detection voltage V21 and the second detection voltage V22 to produce a second output voltage V2. In particular, the first voltage detection unit 231 and the second voltage detection unit 232 can be implemented by the circuit as shown in FIG. 2.

When contact statuses of the relay 21 are normal, the first detection voltage V11 is equal to the first detection voltage V21, and the second detection voltage V12 is equal to the second detection voltage V22. Hence, the first output voltage V1 outputted from the first voltage detection unit 231 is equal to the second output voltage V2 outputted from the second voltage detection unit 232. Accordingly, the normal contact statuses of the relay 21 can be detected out when a voltage comparison unit 24 compares that the first output voltage V1 is equal to the second output voltage V2.

In addition, when the first contact C1 and the second contact C2 of the relay 21 are closed, the relay 21 is operated under a normal power supply as similarly shown in FIG. 4. Because the first detection voltage V11 is not equal to the first detection voltage V21 but the second detection voltage V12 is equal to the second detection voltage V22, the normal contact statuses of the relay 21 can be detected out when the voltage comparison unit 14 compares that the first output voltage V1 is not equal to the second output voltage V2.

On the contrary, when contact statuses of the relay 21 are abnormal, such as the first contact C1 and the second contact C2 of the relay 21 are stuck together (the contact status between the first contact C1 and the second contact C2 of the relay 21 is normally open), the first detection voltage V11 is not equal to the first detection voltage V21 but the second detection voltage V12 is equal to the second detection voltage V22. Accordingly, the abnormal contact statuses of the relay 21 can be detected out when the voltage comparison unit 14 compares that the first output voltage V1 is not equal to the second output voltage V2.

Figure 5:
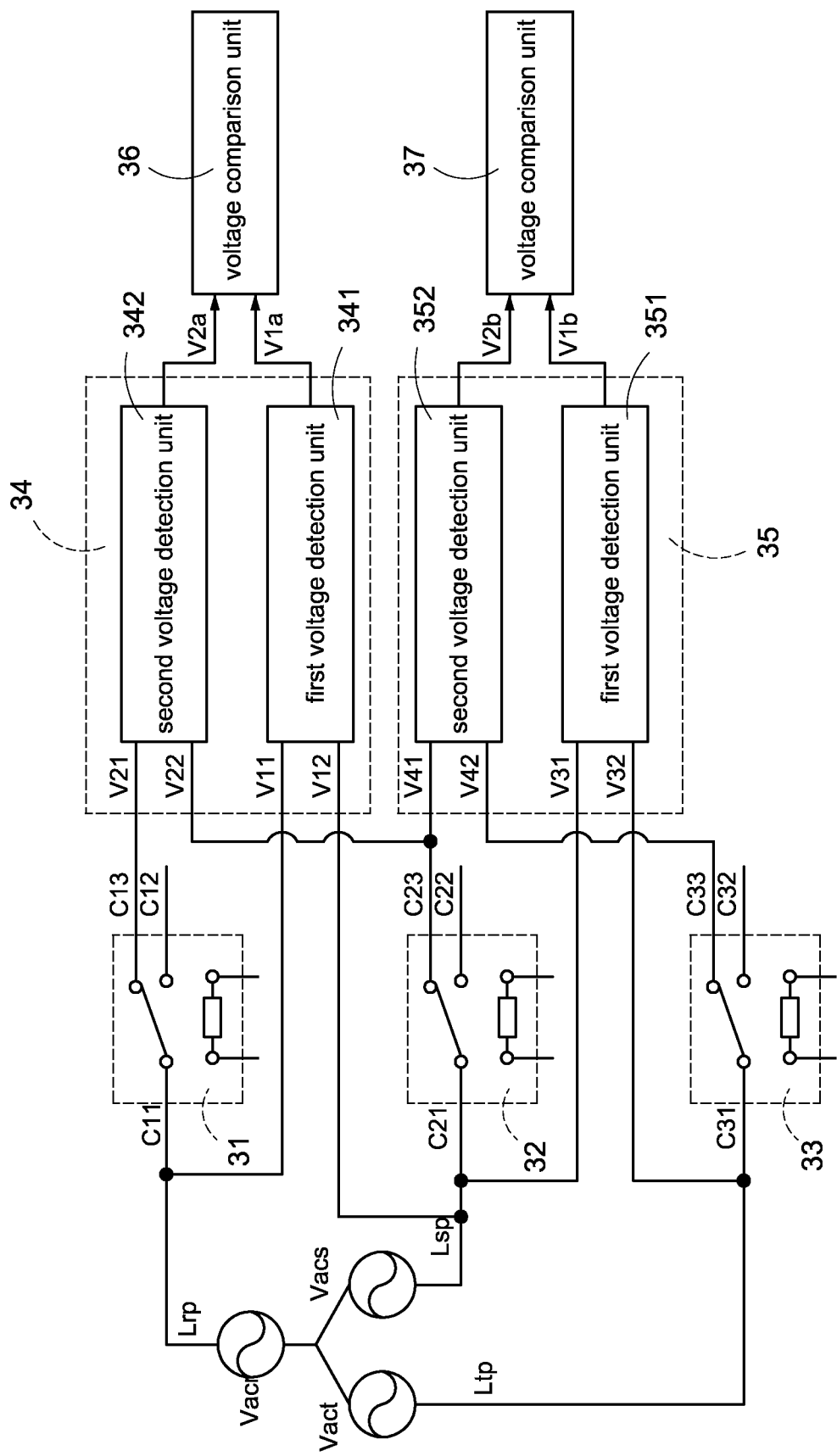
FIG. 5 is a schematic block diagram of the relay detection apparatus according to a third embodiment of the present disclosure.

Reference is made to FIG. 5 which is a schematic block diagram of the relay detection apparatus according to a third embodiment of the present disclosure. Comparing to the first embodiment as shown in FIG. 1, the relay detection apparatus is operated in a three-phase three-wire (3Φ3W) AC power system. In this embodiment, the relay detection apparatus provides three relays, namely, a first relay 31, a second relay 32, and a third relay 33. The first relay 31 is connected to an R-phase line path Lrp, the second relay 32 is connected to an S-phase line path Lsp, and the third relay 33 is connected to a T-phase line path Ltp.

It is assumed that the relay detection apparatus provides two voltage detection modules 34,35. The voltage detection module 34 has a first voltage detection unit 341 and a second voltage detection unit 342; the voltage detection module 35 has a first voltage detection unit 351 and a second voltage detection unit 352. The first voltage detection unit 341 is connected to the R-phase line path Lrp and the first contact C11 of the first relay 31 to receive a first detection voltage V11, and also connected to the S-phase line path Lsp and the first contact C21 of the second relay 32 to receive a second detection voltage V12. The second voltage detection unit 342 is connected to the third contact C13 of the first relay 31 to receive a first detection voltage V21, and also connected to the third contact C23 of the second relay 32 to receive a second detection voltage V22. The first voltage detection unit 341 of the voltage detection module 34 receives the first detection voltage V11 and the second detection voltage V12, and produces a first output voltage V1a. The second voltage detection unit 342 of the voltage detection module 34 receives the first detection voltage V21 and the second detection voltage V22, and produces a second output voltage V2a. A voltage comparison unit 36 receives the first output voltage V1a and the second output voltage V2a to detect contact statuses of the first relay 31 and the second relay 32 according to the relationship between the first output voltage V1a and the second output voltage V2a.

In addition, the first voltage detection unit 351 is connected to the S-phase line path Lsp and the first contact C21 of the second relay 32 to receive a first detection voltage V31, and also connected to the T-phase line path Ltp and the first contact C31 of the third relay 33 to receive a second detection voltage V32. The second voltage detection unit 352 is connected to the third contact C23 of the second relay 32 to receive a first detection voltage V41, and also connected to the third contact C33 of the third relay 33 to receive a second detection voltage V42. The first voltage detection unit 351 of the voltage detection module 35 receives the first detection voltage V31 and the second detection voltage V32, and produces a first output voltage V1b. The second voltage detection unit 352 of the voltage detection module 35 receives the first detection voltage V41 and the second detection voltage V42, and produces a second output voltage V2b. A voltage comparison unit 37 receives the first output voltage V1b and the second output voltage V2b to detect contact statuses of the second relay 32 and the third relay 33 according to the relationship between the first output voltage V1b and the second output voltage V2b. In particular, the first voltage detection units 341,351 and the second voltage detection units 342,352 can be implemented by the circuit as shown in FIG. 2.

When contact statuses of the first relay 31 and the second relay 32 are normal, the first detection voltage V11 is equal to the first detection voltage V21 and the second detection voltage V12 is equal to the second detection voltage V22. Hence, the first output voltage V1a outputted from the first voltage detection unit 341 is equal to the second output voltage V2a outputted from the second voltage detection unit 342. Accordingly, the normal contact statuses of the first relay 31 and the second relay 32 can be detected out when the voltage comparison unit 36 compares that the first output voltage V1a is equal to the second output voltage V2a. In addition, when contact statuses of the second relay 32 and the third relay 33 are normal, the first detection voltage V31 is equal to the first detection voltage V41 and the second detection voltage V32 is equal to the second detection voltage V42. Hence, the first output voltage V1b outputted from the first voltage detection unit 351 is equal to the second output voltage V2b outputted from the second voltage detection unit 352. Accordingly, the normal contact statuses of the second relay 32 and the third relay 33 can be detected out when the voltage comparison unit 37 compares that the first output voltage V1b is equal to the second output voltage V2b.

On the contrary, when contact statuses of the first relay 31 are abnormal, such as the first contact C11 and the second contact C12 of the first relay 31 are stuck together (the contact status between the first contact C11 and the second contact C12 of the first relay 31 is normally open), the first detection voltage V11 is not equal to the first detection voltage V21 but the second detection voltage V12 is equal to the second detection voltage V22. Accordingly, the abnormal contact statuses of the first relay 31 can be detected out when the voltage comparison unit 36 compares that the first output voltage V1a is not equal to the second output voltage V2a. In addition, when contact statuses of the second relay 32 are abnormal, such as the first contact C21 and the second contact C22 of the second relay 32 are stuck together (the contact status between the first contact C21 and the second contact C22 of the second relay 32 is normally open), the first detection voltage V31 is not equal to the first detection voltage V41 but the second detection voltage V32 is equal to the second detection voltage V42. Accordingly, the abnormal contact statuses of the second relay 32 can be detected out when the voltage comparison unit 37 compares that the first output voltage V1b is not equal to the second output voltage V2b. In addition, when contact statuses of the third relay 33 are abnormal, such as the first contact C31 and the second contact C32 of the third relay 33 are stuck together (the contact status between the first contact C31 and the second contact C32 of the third relay 33 is normally open), the first detection voltage V31 is equal to the first detection voltage V41 but the second detection voltage V32 is not equal to the second detection voltage V42. Accordingly, the abnormal contact statuses of the third relay 33 can be detected out when the voltage comparison unit 37 compares that the first output voltage V1b is not equal to the second output voltage V2b.

Figure 6:
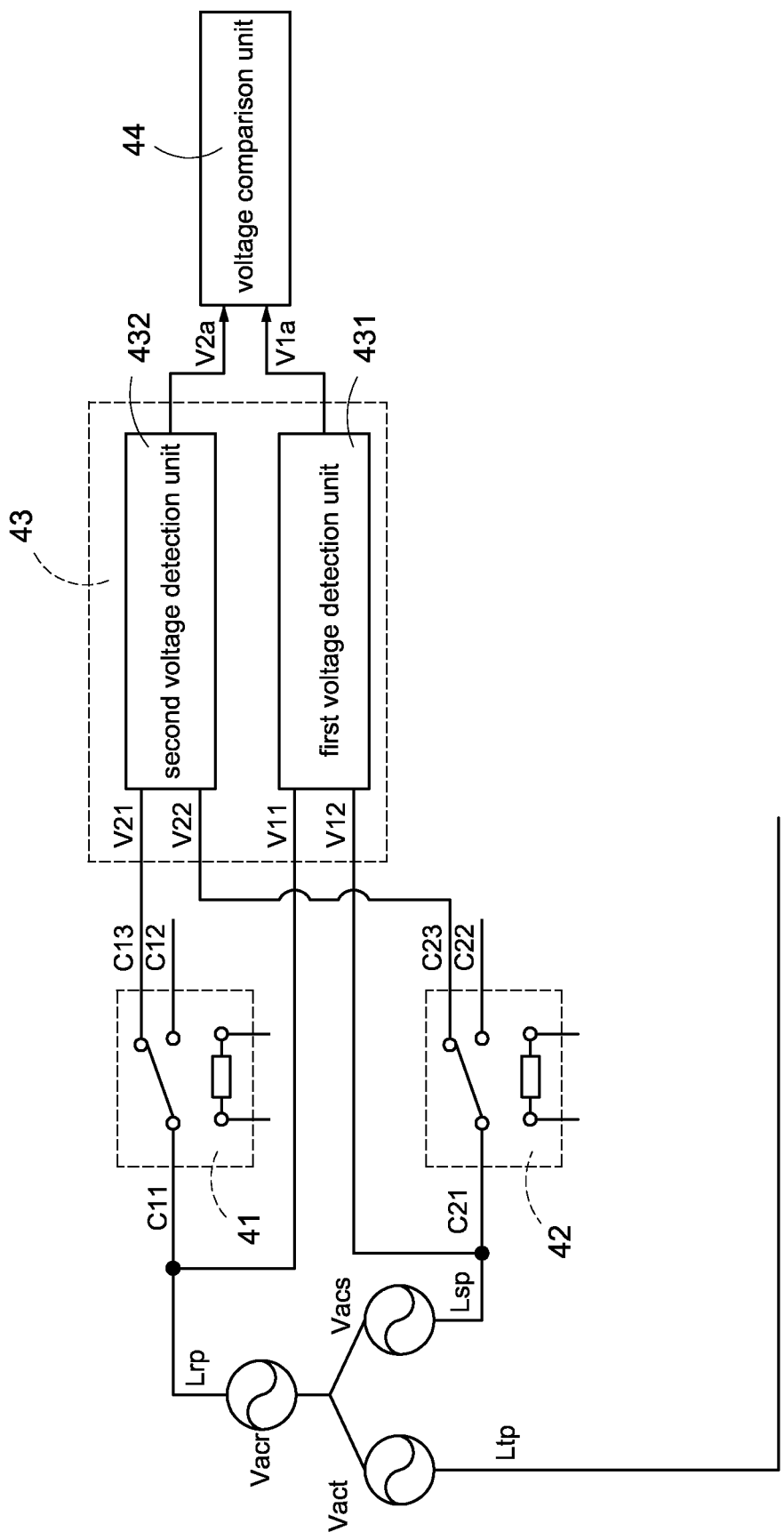
FIG. 6 is a schematic block diagram of the relay detection apparatus according to a fourth embodiment of the present disclosure.

Reference is made to FIG. 6 which is a schematic block diagram of the relay detection apparatus according to a fourth embodiment of the present disclosure. Comparing to the third embodiment as shown in FIG. 5, the relay detection apparatus is also operated in a three-phase three-wire (3Φ3W) AC power system but the relay detection apparatus provides only two relays, namely, a first relay 41 and a second relay 42. The first relay 41 is connected to an R-phase line path Lrp and the second relay 42 is connected to an S-phase line path Lsp. It is assumed that the relay detection apparatus provides a voltage detection module 43, and the voltage detection module 43 has a first voltage detection unit 431 and a second voltage detection unit 432.

The first voltage detection unit 431 is connected to the R-phase line path Lrp and the first contact C11 of the first relay 41 to receive a first detection voltage V11, and also connected to the S-phase line path Lsp and the first contact C21 of the second relay 42 to receive a second detection voltage V12. The second voltage detection unit 432 is connected to the third contact C13 of the first relay 41 to receive a first detection voltage V21, and also connected to the third contact C23 of the second relay 42 to receive a second detection voltage V22. The first voltage detection unit 431 of the voltage detection module 43 receives the first detection voltage V11 and the second detection voltage V12, and produces a first output voltage V1a. The second voltage detection unit 432 of the voltage detection module 43 receives the first detection voltage V21 and the second detection voltage V22, and produces a second output voltage V2a. In particular, the first voltage detection unit 431 and the second voltage detection unit 432 can be implemented by the circuit as shown in FIG. 2.

When contact statuses of the first relay 41 are normal, the first detection voltage V11 is equal to the first detection voltage V21, and the second detection voltage V12 is equal to the second detection voltage V22. Hence, the first output voltage V1a outputted from the first voltage detection unit 431 is equal to the second output voltage V2a outputted from the second voltage detection unit 432. Accordingly, the normal contact statuses of the first relay 41 can be detected out when a voltage comparison unit 44 compares that the first output voltage V1a is equal to the second output voltage V2a. In addition, when contact statuses of the second relay 42 are normal, the first detection voltage V11 is equal to the first detection voltage V21, and the second detection voltage V12 is equal to the second detection voltage V22. Hence, the first output voltage V1a outputted from the first voltage detection unit 431 is equal to the second output voltage V2a outputted from the second voltage detection unit 432. Accordingly, the normal contact statuses of the second relay 42 can be detected out when the voltage comparison unit 44 compares that the first output voltage V1a is equal to the second output voltage V2a.

On the contrary, when contact statuses of the first relay 41 are abnormal, such as the first contact C11 and the second contact C12 of the first relay 41 are stuck together (the contact status between the first contact C11 and the second contact C12 of the first relay 41 is normally open), the first detection voltage V11 is not equal to the first detection voltage V21 but the second detection voltage V12 is equal to the second detection voltage V22. Accordingly, the abnormal contact statuses of the first relay 41 can be detected out when the voltage comparison unit 44 compares that the first output voltage V1a is not equal to the second output voltage V2a. In addition, when contact statuses of the second relay 42 are abnormal, such as the first contact C21 and the second contact C22 of the second relay 42 are stuck together (the contact status between the first contact C21 and the second contact C22 of the second relay 42 is normally open), the first detection voltage V11 is equal to the first detection voltage V21 but the second detection voltage V12 is not equal to the second detection voltage V22. Accordingly, the abnormal contact statuses of the second relay 42 can be detected out when the voltage comparison unit 44 compares that the first output voltage V1a is not equal to the second output voltage V2a.

Figure 7:
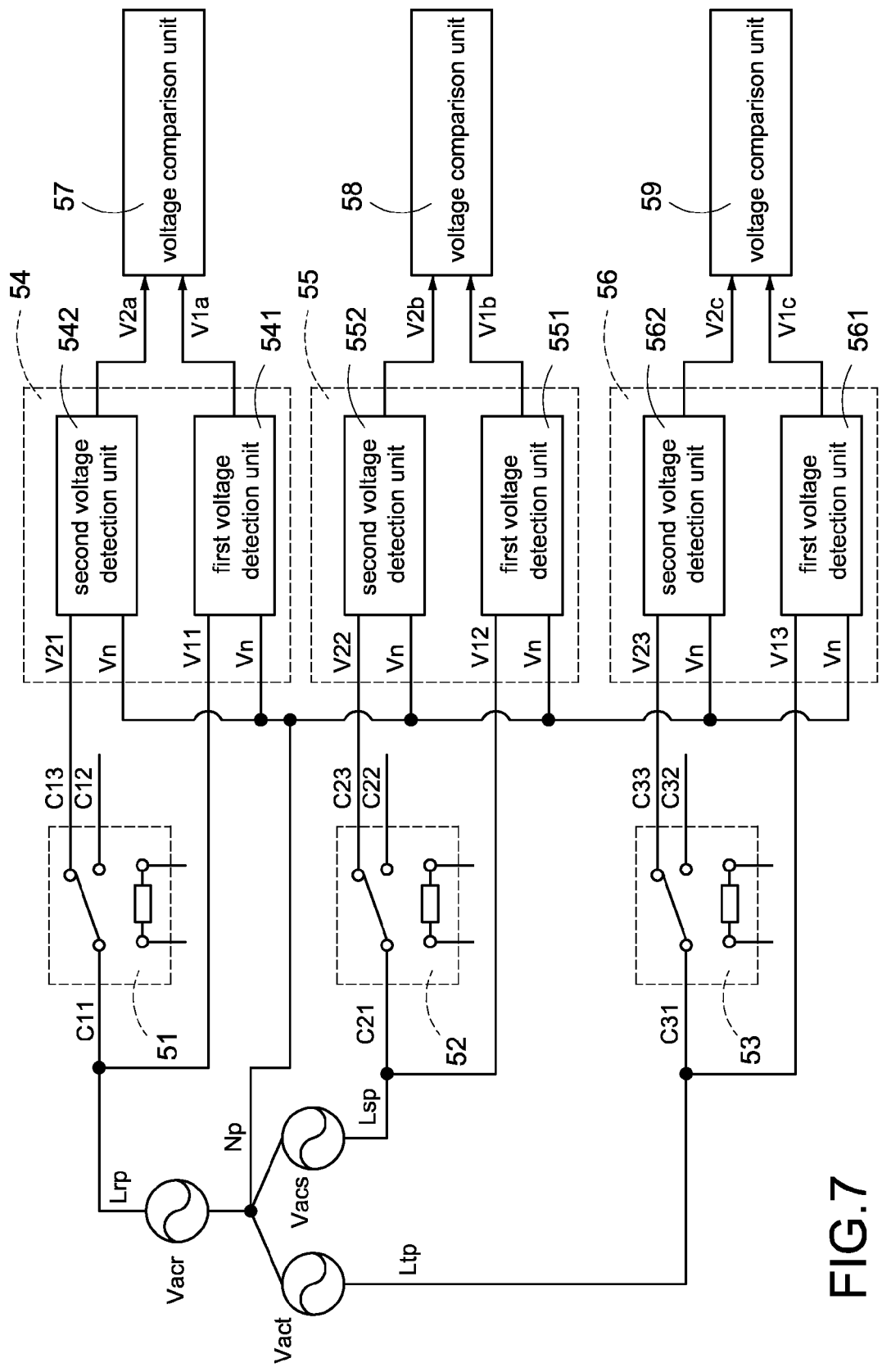
FIG. 7 is a schematic block diagram of the relay detection apparatus according to a fifth embodiment of the present disclosure.

Reference is made to FIG. 7 which is a schematic block diagram of the relay detection apparatus according to a fifth embodiment of the present disclosure. Comparing to the third embodiment as shown in FIG. 5, the relay detection apparatus is operated in a three-phase four-wire (3Φ4W) AC power system and the relay detection apparatus provides three relays, namely, a first relay 51, a second relay 52, and a third relay 53. The first relay 51 is connected to an R-phase line path Lrp, the second relay 52 is connected to an S-phase line path Lsp, and the third relay 53 is connected to a T-phase line path Ltp.

It is assumed that the relay detection apparatus provides three voltage detection modules 54,55,56. The voltage detection module 54 has a first voltage detection unit 541 and a second voltage detection unit 542; the voltage detection module 55 has a first voltage detection unit 551 and a second voltage detection unit 552; the voltage detection module 56 has a first voltage detection unit 561 and a second voltage detection unit 562. The first voltage detection unit 541 is connected to the R-phase line path Lrp and the first contact C11 of the first relay 51 to receive a first detection voltage V11, and also connected to a neutral path Np to receive a neutral voltage Vn. The second voltage detection unit 542 is connected to the third contact C13 of the first relay 51 to receive a first detection voltage V21, and also connected to the neutral path Np to receive the neutral voltage Vn. The first voltage detection unit 541 of the voltage detection module 54 receives the first detection voltage V11 and the neutral voltage Vn, and produces a first output voltage V1a. The second voltage detection unit 542 of the voltage detection module 54 receives the first detection voltage V21 and the neutral voltage Vn, and produces a second output voltage V2a. A voltage comparison unit 57 receives the first output voltage V1a and the second output voltage V2a to detect contact statuses of the first relay 51 according to the relationship between the first output voltage V1a and the second output voltage V2a.

In addition, the first voltage detection unit 551 is connected to the S-phase line path Lsp and the first contact C21 of the second relay 52 to receive a second detection voltage V12, and also connected to the neutral path Np to receive the neutral voltage Vn. The second voltage detection unit 552 is connected to the third contact C23 of the second relay 52 to receive a second detection voltage V22, and also connected to the neutral path Np to receive the neutral voltage Vn. The first voltage detection unit 551 of the voltage detection module 55 receives the second detection voltage V12 and the neutral voltage Vn, and produces a first output voltage V1b. The second voltage detection unit 552 of the voltage detection module 55 receives the second detection voltage V22 and the neutral voltage Vn, and produces a second output voltage V2b. A voltage comparison unit 58 receives the first output voltage V1b and the second output voltage V2b to detect contact statuses of the second relay 52 according to the relationship between the first output voltage V1b and the second output voltage V2b.

In addition, the first voltage detection unit 561 is connected to the T-phase line path Ltp and the first contact C31 of the third relay 53 to receive a third detection voltage V13, and also connected to the neutral path Np to receive the neutral voltage Vn. The second voltage detection unit 552 is connected to the third contact C33 of the third relay 53 to receive a third detection voltage V23, and also connected to the neutral path Np to receive the neutral voltage Vn. The first voltage detection unit 561 of the voltage detection module 56 receives the third detection voltage V13 and the neutral voltage Vn, and produces a first output voltage V1c. The second voltage detection unit 562 of the voltage detection module 56 receives the third detection voltage V23 and the neutral voltage Vn, and produces a second output voltage V2c. A voltage comparison unit 59 receives the first output voltage V1c and the second output voltage V2c to detect contact statuses of the third relay 53 according to the relationship between the first output voltage V1c and the second output voltage V2c. In particular, the first voltage detection units 551,561 and the second voltage detection units 552,562 can be implemented by the circuit as shown in FIG. 2.

When contact statuses of the first relay 51 are normal, the first detection voltage V11 is equal to the first detection voltage V21, and the neutral voltages Vn are identical. Hence, the first output voltage V1a outputted from the first voltage detection unit 541 is equal to the second output voltage V2a outputted from the second voltage detection unit 542. Accordingly, the normal contact statuses of the first relay 51 can be detected out when a voltage comparison unit 57 compares that the first output voltage V1a is equal to the second output voltage V2a. In addition, when contact statuses of the second relay 52 are normal, the second detection voltage V12 is equal to the second detection voltage V22, and the neutral voltages Vn are identical. Hence, the first output voltage V1b outputted from the first voltage detection unit 551 is equal to the second output voltage V2b outputted from the second voltage detection unit 552. Accordingly, the normal contact statuses of the second relay 52 can be detected out when a voltage comparison unit 58 compares that the first output voltage V1b is equal to the second output voltage V2b. In addition, when contact statuses of the third relay 53 are normal, the third detection voltage V13 is equal to the third detection voltage V23, and the neutral voltages Vn are identical. Hence, the first output voltage V1c outputted from the first voltage detection unit 561 is equal to the second output voltage V2c outputted from the second voltage detection unit 562. Accordingly, the normal contact statuses of the third relay 53 can be detected out when a voltage comparison unit 59 compares that the first output voltage V1c is equal to the second output voltage V2c.

On the contrary, when contact statuses of the first relay 51 are abnormal, such as the first contact C11 and the second contact C12 of the first relay 51 are stuck together (the contact status between the first contact C11 and the second contact C12 of the first relay 51 is normally open), the first detection voltage V11 is not equal to the first detection voltage V21 but the neutral voltages Vn are identical. Accordingly, the abnormal contact statuses of the first relay 51 can be detected out when the voltage comparison unit 57 compares that the first output voltage V1a is not equal to the second output voltage V2a. In addition, when contact statuses of the second relay 52 are abnormal, such as the first contact C21 and the second contact C22 of the second relay 52 are stuck together (the contact status between the first contact C21 and the second contact C22 of the second relay 52 is normally open), the second detection voltage V12 is equal to the second detection voltage V22 but the neutral voltages Vn are identical. Accordingly, the abnormal contact statuses of the second relay 52 can be detected out when the voltage comparison unit 58 compares that the first output voltage V1b is not equal to the second output voltage V2b. In addition, when contact statuses of the third relay 53 are abnormal, such as the first contact C31 and the second contact C32 of the third relay 53 are stuck together (the contact status between the first contact C31 and the second contact C32 of the third relay 53 is normally open), the third detection voltage V13 is equal to the third detection voltage V23 but the neutral voltages Vn are identical. Accordingly, the abnormal contact statuses of the third relay 53 can be detected out when the voltage comparison unit 59 compares that the first output voltage V1c is not equal to the second output voltage V2c.

Figure 8:
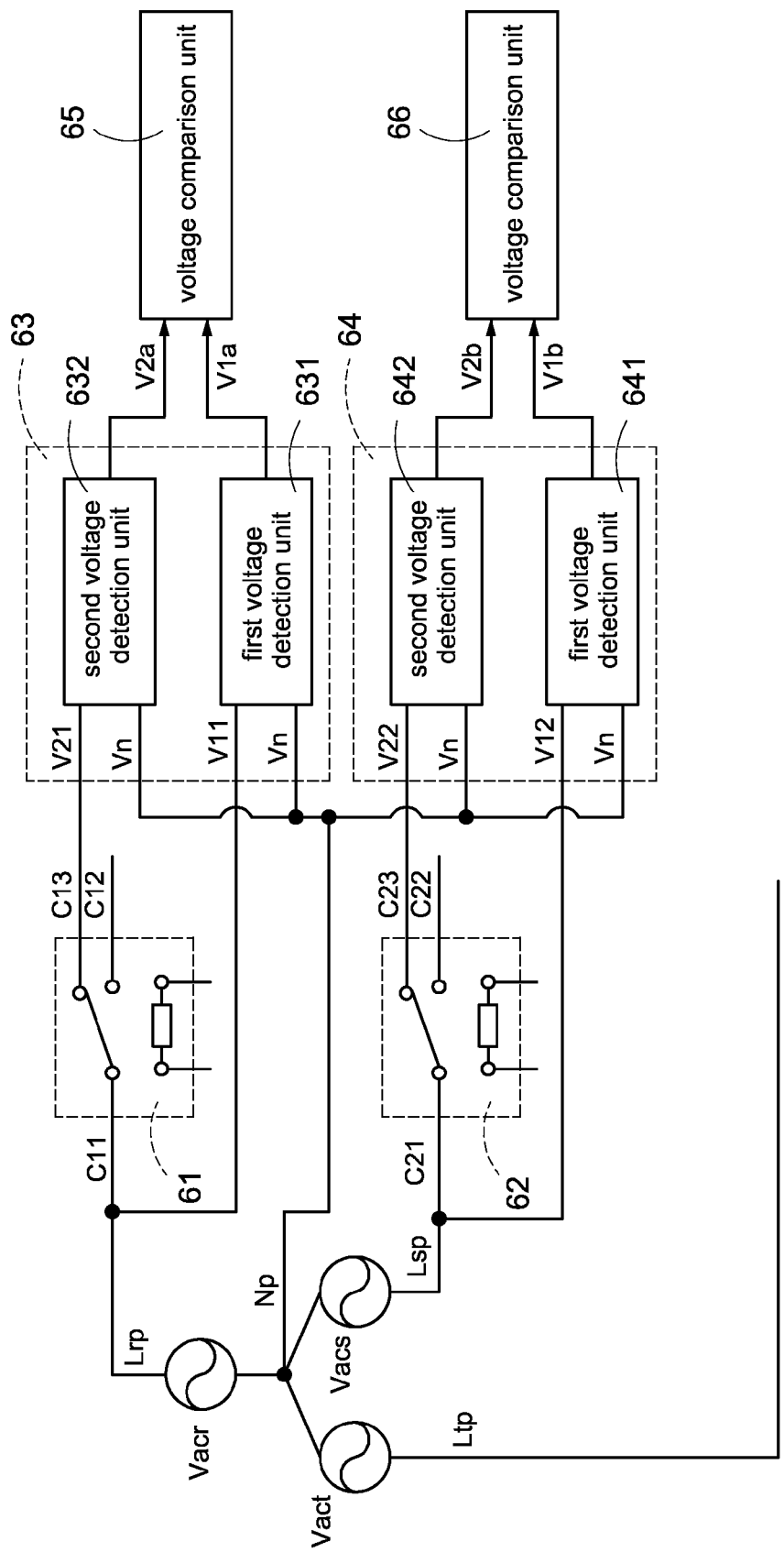
FIG. 8 is a schematic block diagram of the relay detection apparatus according to a sixth embodiment of the present disclosure.

Reference is made to FIG. 8 which is a schematic block diagram of the relay detection apparatus according to a sixth embodiment of the present disclosure. Comparing to the fifth embodiment as shown in FIG. 7, the relay detection apparatus is operated in a three-phase four-wire (3Φ4W) AC power system but the relay detection apparatus provides only two relays, namely, a first relay 61 and a second relay 62. The first relay 61 is connected to an R-phase line path Lrp and the second relay 62 is connected to an S-phase line path Lsp. It is assumed that the relay detection apparatus provides two voltage detection modules 63,64. The voltage detection module 63 has a first voltage detection unit 631 and a second voltage detection unit 632; the voltage detection module 64 has a first voltage detection unit 641 and a second voltage detection unit 642.

The first voltage detection unit 631 is connected to the R-phase line path Lrp and the first contact C11 of the first relay 61 to receive a first detection voltage V11, and also connected to a neutral path Np to receive a neutral voltage Vn. The second voltage detection unit 632 is connected to the third contact C13 of the first relay 61 to receive a first detection voltage V21, and also connected to the neutral path Np to receive the neutral voltage Vn. The first voltage detection unit 631 of the voltage detection module 63 receives the first detection voltage V11 and the neutral voltage Vn, and produces a first output voltage V1a. The second voltage detection unit 632 of the voltage detection module 63 receives the first detection voltage V21 and the neutral voltage Vn, and produces a second output voltage V2a. A voltage comparison unit 65 receives the first output voltage V1a and the second output voltage V2a to detect contact statuses of the first relay 61 according to the relationship between the first output voltage V1a and the second output voltage V2a.

In addition, the first voltage detection unit 641 is connected to the S-phase line path Lsp and the first contact C21 of the second relay 62 to receive a second detection voltage V12, and also connected to the neutral path Np to receive the neutral voltage Vn. The second voltage detection unit 642 is connected to the third contact C23 of the second relay 62 to receive a second detection voltage V22, and also connected to the neutral path Np to receive the neutral voltage Vn. The first voltage detection unit 641 of the voltage detection module 64 receives the second detection voltage V12 and the neutral voltage Vn, and produces a first output voltage V1b. The second voltage detection unit 642 of the voltage detection module 64 receives the second detection voltage V22 and the neutral voltage Vn, and produces a second output voltage V2b. A voltage comparison unit 66 receives the first output voltage V1b and the second output voltage V2b to detect contact statuses of the second relay 62 according to the relationship between the first output voltage V1b and the second output voltage V2b.

When contact statuses of the first relay 61 are normal, the first detection voltage V11 is equal to the first detection voltage V21, and the neutral voltages Vn are identical. Hence, the first output voltage V1a outputted from the first voltage detection unit 631 is equal to the second output voltage V2a outputted from the second voltage detection unit 632. Accordingly, the normal contact statuses of the first relay 61 can be detected out when a voltage comparison unit 65 compares that the first output voltage V1a is equal to the second output voltage V2a. In addition, when contact statuses of the second relay 62 are normal, the second detection voltage V12 is equal to the second detection voltage V22, and the neutral voltages Vn are identical. Hence, the first output voltage V1b outputted from the first voltage detection unit 641 is equal to the second output voltage V2b outputted from the second voltage detection unit 642. Accordingly, the normal contact statuses of the second relay 62 can be detected out when a voltage comparison unit 66 compares that the first output voltage V1b is equal to the second output voltage V2b.

On the contrary, when contact statuses of the first relay 61 are abnormal, such as the first contact C11 and the second contact C12 of the first relay 61 are stuck together (the contact status between the first contact C11 and the second contact C12 of the first relay 61 is normally open), the first detection voltage V11 is not equal to the first detection voltage V21 but the neutral voltages Vn are identical. Accordingly, the abnormal contact statuses of the first relay 61 can be detected out when the voltage comparison unit 65 compares that the first output voltage V1a is not equal to the second output voltage V2a. In addition, when contact statuses of the second relay 62 are abnormal, such as the first contact C21 and the second contact C22 of the second relay 62 are stuck together (the contact status between the first contact C21 and the second contact C22 of the second relay 62 is normally open), the second detection voltage V12 is equal to the second detection voltage V22 but the neutral voltages Vn are identical. Accordingly, the abnormal contact statuses of the second relay 62 can be detected out when the voltage comparison unit 66 compares that the first output voltage V1b is not equal to the second output voltage V2b.

Figure 9:
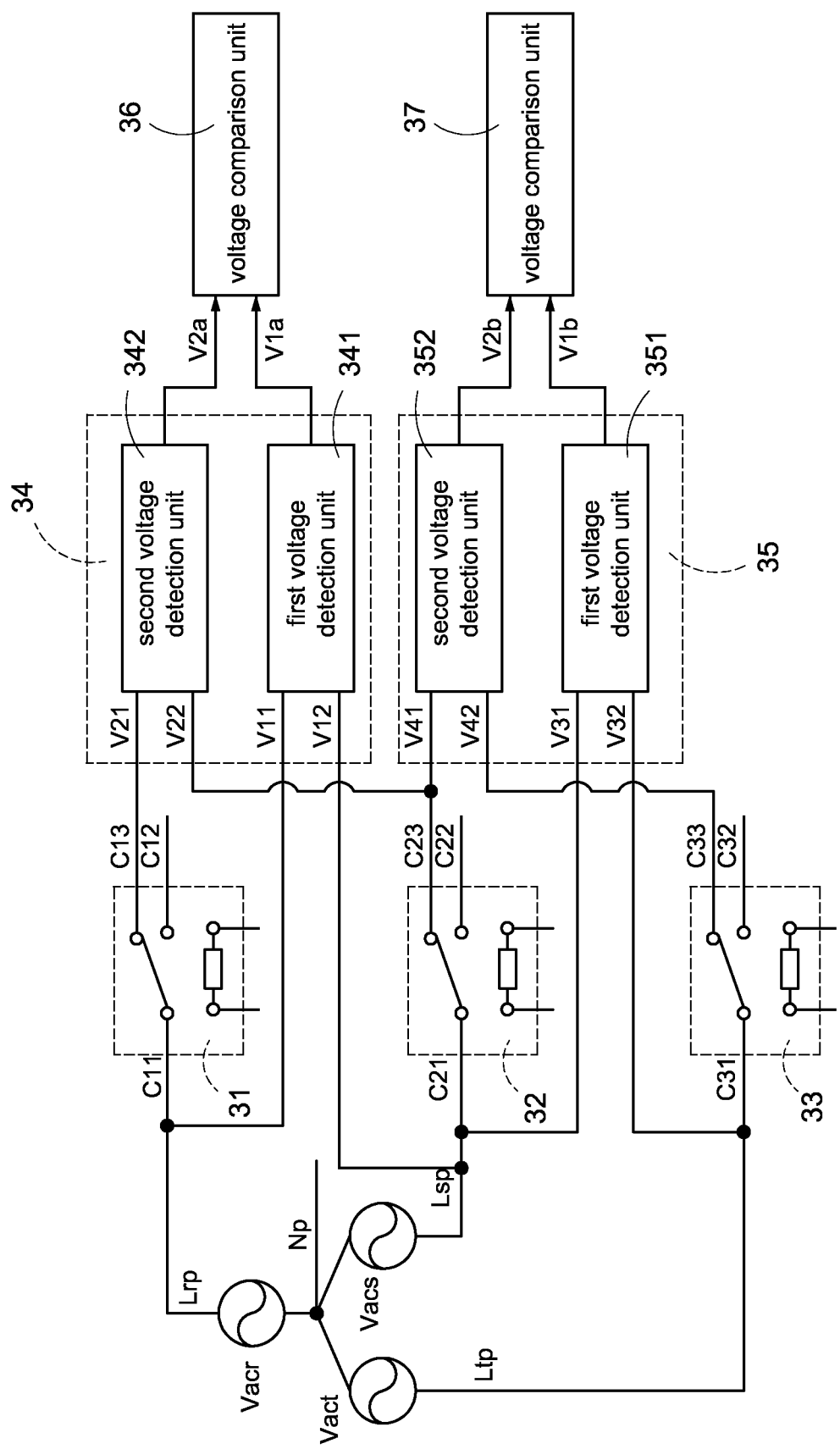
FIG. 9 is a schematic block diagram of the relay detection apparatus according to a seventh embodiment of the present disclosure.
Figure 10:
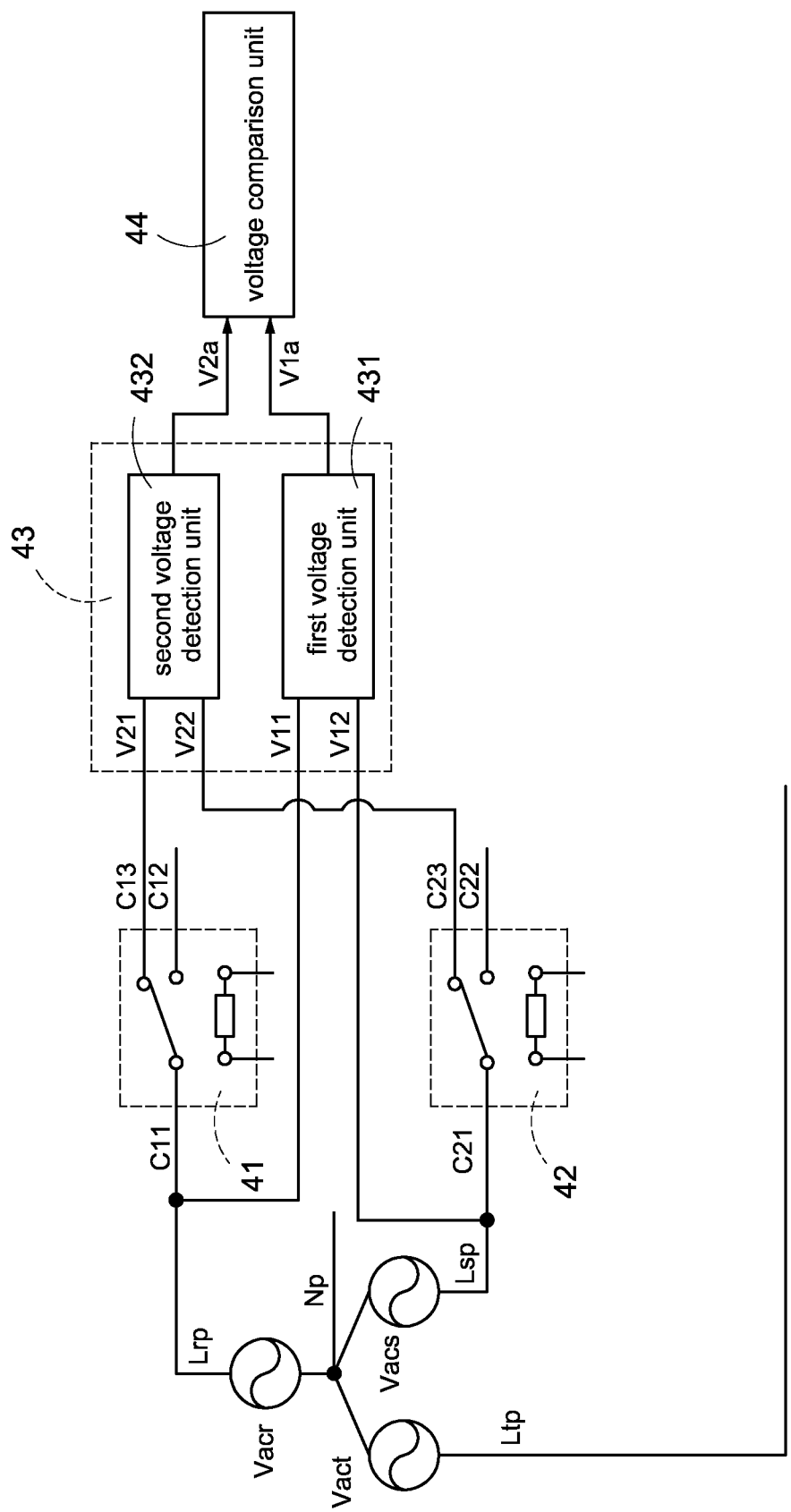
FIG. 10 is a schematic block diagram of the relay detection apparatus according to an eighth embodiment of the present disclosure.

Reference is made to FIG. 9 which is a schematic block diagram of the relay detection apparatus according to a seventh embodiment of the present disclosure. Comparing to the third embodiment as shown in FIG. 5, the relay detection apparatus is operated in a three-phase four-wire (3Φ4W) AC power system. That is, the neutral path Np is provided in the seventh embodiment rather than the third embodiment. Hence, the operation of the seventh embodiment can be referred to that of the third embodiment. Reference is made to FIG. 10 which is a schematic block diagram of the relay detection apparatus according to an eighth embodiment of the present disclosure. Comparing to the fourth embodiment as shown in FIG. 6, the relay detection apparatus is operated in a three-phase four-wire (3Φ4W) AC power system. That is, the neutral path Np is provided in the eighth embodiment rather than the fourth embodiment. Hence, the operation of the eighth embodiment can be referred to that of the fourth embodiment.

Figure 11:
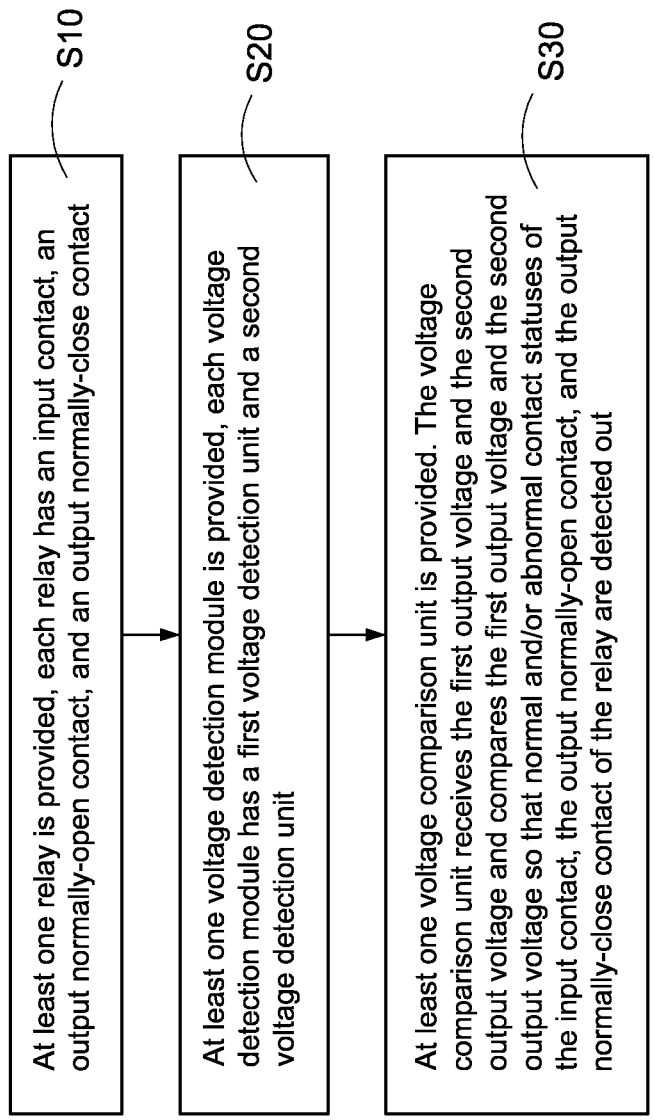
FIG. 11 is a flowchart of a method of operating a relay detection apparatus according to the present disclosure.

Reference is made to FIG. 11 which is a flowchart of a method of operating a relay detection apparatus according to the present disclosure. In particular, the relay detection apparatus can be operated in a single-phase AC power source or a three-phase AC power source (including a three-phase three-wire AC power source and a three-phase four-wire AC power source). The method includes following steps: First, at least one relay is provided, each relay has an input contact, an output normally-open contact, and an output normally-close contact (S10). Afterward, at least one voltage detection module is provided, each voltage detection module has a first voltage detection unit and a second voltage detection unit (S20). The first voltage detection unit receives a voltage at the input contact to be a first detection voltage and produce a first output voltage. The second voltage detection unit receives a voltage at the output normally-close contact to be a second detection voltage and produce a second output voltage. Finally, at least one voltage comparison unit is provided (S30). The voltage comparison unit receives the first output voltage and the second output voltage and compares the first output voltage and the second output voltage so that normal and/or abnormal contact statuses of the input contact, the output normally-open contact, and the output normally-close contact of the relay are detected out. In particular, when the first output voltage is equal to the second output voltage, the voltage comparison unit compares that the first output voltage is equal to the second output voltage so that normal contact statuses of the input contact, the output normally-open contact, and the output normally-close contact of the relay are detected out. On other contrary, when the first output voltage is not equal to the second output voltage, the voltage comparison unit compares that the first output voltage is not equal to the second output voltage so that abnormal contact statuses of the input contact, the output normally-open contact, and the output normally-close contact of the relay are detected out.

In conclusion, the present disclosure has following advantages:

1. The relay detection apparatus can be widely applied to different circuits in the single-phase (1Φ) AC power system and three-phase (3Φ) AC power system;

2. The normal and/or abnormal contact statuses of the contacts of the relay can be detected out by simply detecting voltage at the contacts; and 3. Once the abnormal contact status of the contacts of the relay is detected out, the relay is interruptedly used to ensure safety of operators.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A relay detection apparatus operated in a single-phase AC power source, comprising:
   first relay, the first relay comprising:
      an input contact;
      an output normally-open contact; and
      an output normally-close contact, wherein the output normally-open contact forms a normally-open path with the input contact, and the output normally-close contact forms a normally-close contact with the input contact;
   a voltage detection module, comprising:
      a first voltage detection unit configured to receive a voltage at the input contact and produce a first output voltage; and
      a second voltage detection unit configured to receive a voltage at the output normally-close contact and produce a second output voltage; and
   a voltage comparison unit configured to receive the first output voltage and the second output voltage and compare the first output voltage and the second output voltage so that normal and abnormal contact statuses of the input contact, the output normally-open contact, and the output normally-close contact of the first relay are detected out;
   wherein the first relay is connected to a line path of the single-phase AC power source; the first voltage detection unit of the voltage detection module is configured to receive the voltage at the input contact of the relay to be a first input detection voltage and receive a voltage of a ground path of the single-phase AC power source to be a second input detection voltage, and produce the first output voltage; the second voltage detection unit of the voltage detection module is configured to receive the voltage at the output normally-close contact of the relay to be a first output detection voltage and receive a voltage of the ground path of the single-phase AC power source to be a second output detection voltage, and produce the second output voltage.

2. The relay detection apparatus in claim 1, further comprises a second relay, wherein the second relay is connected to a ground path of the single-phase AC power source; the first voltage detection unit of the voltage detection module is configured to receive the voltage at the input contact of the second relay to be a second input detection voltage, and produce the first output voltage; the second voltage detection unit of the voltage detection module is configured to receive the voltage at the output normally-close contact of the second relay to be a second output detection voltage, and produce the second output voltage.

3. The relay detection apparatus in claim 2, wherein when a voltage difference between the first input detection voltage and the second input detection voltage is equal to a voltage difference between the first output detection voltage and the second output detection voltage, the voltage comparison unit is configured to compare that the first output voltage is equal to the second output voltage so that normal contact statuses of the input contacts, the output normally-open contacts, and the output normally-close contacts of the first relay and the second relay are detected out; when the voltage difference between the first input detection voltage and the second input detection voltage is not equal to the voltage difference between the first output detection voltage and the second output detection voltage, the voltage comparison unit is configured to compare that the first output voltage is not equal to the second output voltage so that abnormal contact statuses of the input contact, the output normally-open contact, and the output normally-close contact of the first relay or the second relay are detected out.

4. The relay detection apparatus in claim 2, wherein the first voltage detection unit or the second voltage detection unit is a differential amplifier which is composed of an operational amplifier and a resistor network; wherein two input terminals of the differential amplifier of the first voltage detection unit are configured to receive the voltage at the input contacts of the first relay and the second relay, and two input terminals of the differential amplifier of the second voltage detection unit are configured to receive the voltage at the output normally-close contacts of the first relay and the second relay.

5. The relay detection apparatus in claim 1, wherein when a voltage difference between the first input detection voltage and the second input detection voltage is equal to a voltage difference between the first output detection voltage and the second output detection voltage, the voltage comparison unit is configured to compare that the first output voltage is equal to the second output voltage so that normal contact statuses of the input contact, the output normally-open contact, and the output normally-close contact of the relay are detected out; when the voltage difference between the first input detection voltage and the second input detection voltage is not equal to the voltage difference between the first output detection voltage and the second output detection voltage, the voltage comparison unit is configured to compare that the first output voltage is not equal to the second output voltage so that abnormal contact statuses of the input contact, the output normally-open contact, and the output normally-close contact of the relay are detected out.

6. A relay detection apparatus operated in a three-phase AC power source, comprising:
at least one relay, comprising: an input contact; an output normally-open contact; and an output normally-close contact, wherein the output normally-open contact forms a normally-open path with the input contact, the output normally-close contact forms a normally-close contact with the input contact;
at least one voltage detection module, comprising:
a first voltage detection unit configured to receive a voltage at the input contact and produce a first output voltage; and
a second voltage detection unit configured to receive a voltage at the output normally-close contact and produce a second output voltage; and
at least one voltage comparison unit configured to receive the first output voltage and the second output voltage and compare the first output voltage and the second output voltage so that normal and abnormal contact statuses of the input contact, the output normally-open contact, and the output normally-close contact of the relay are detected out;
wherein when the three-phase AC power source is a three-phase three-wire power source, the number of the at least one relay is two, namely a first relay and a second relay; the first relay is connected to a first phase line path of the three-phase AC power source and the second relay is connected to a second phase line path of the three-phase AC power source; the number of the at least one voltage detection module is one and the voltage detection module has a first voltage detection unit and a second voltage detection unit, the first voltage detection unit of the voltage detection module is configured to receive a voltage at the input contact of the first relay to be a first input detection voltage and receive a voltage at the input contact of the second relay to be a second input detection voltage, and produce the first output voltage; the second voltage detection unit of the voltage detection module is configured to receive a voltage at the output normally-close contact of the first relay to be a first output detection voltage and receive a voltage at the output normally-close contact of the second relay to be a second output detection voltage, and produce the second output voltage.

7. The relay detection apparatus in claim 6, further comprising a third relay, wherein the third relay is connected to a third phase line path of the three-phase AC power source; the number of the at least one voltage detection module is two, namely a first voltage detection module and a second voltage detection module, the first voltage detection unit of the first voltage detection module is configured to receive the voltage at the input contact of the first relay to be a first input detection voltage and receive the voltage at the input contact of the second relay to be a second input detection voltage, and produce the first output voltage; the second voltage detection unit of the first voltage detection module is configured to receive the voltage at the output normally-close contact of the first relay to be a first output detection voltage and receive the voltage at the output normally-close contact of the second relay to be a second output detection voltage, and produce the second output voltage; the first voltage detection unit of the second voltage detection module is configured to receive the voltage at the input contact of the second relay to be a third input detection voltage and receive the voltage at the input contact of the third relay to be a fourth input detection voltage, and produce the first output voltage; the second voltage detection unit of the second voltage detection module is configured to receive the voltage at the output normally-close contact of the second relay to be a third output detection voltage and receive the voltage at the output normally-close contact of the third relay to be a fourth output detection voltage, and produce the second output voltage.

8. The relay detection apparatus in claim 7, wherein when a voltage difference between the first input detection voltage and the second input detection voltage is equal to a voltage difference between the first output detection voltage and the second output detection voltage, the voltage comparison unit is configured to compare that the first output voltage is equal to the second output voltage so that normal contact statuses of the input contacts, the output normally-open contacts, and the output normally-close contacts of the first relay and the second relay are detected out; when a voltage difference between the third input detection voltage and the fourth input detection voltage is equal to a voltage difference between the third output detection voltage and the fourth output detection voltage, the voltage comparison unit is configured to compare that the first output voltage is equal to the second output voltage so that normal contact statuses of the input contacts, the output normally-open contacts, and the output normally-close contacts of the second relay and the third relay are detected out; when the voltage difference between the first input detection voltage and the second input detection voltage is not equal to the voltage difference between the first output detection voltage and the second output detection voltage, the voltage comparison unit is configured to compare that the first output voltage is not equal to the second output voltage so that abnormal contact statuses of the input contact, the output normally-open contact, and the output normally-close contact of the first relay or the second relay are detected out; when the voltage difference between the third input detection voltage and the fourth input detection voltage is not equal to the voltage difference between the third output detection voltage and the fourth output detection voltage, the voltage comparison unit is configured to compare that the first output voltage is not equal to the second output voltage so that abnormal contact statuses of the input contact, the output normally-open contact, and the output normally-close contact of the second relay or the third relay are detected out.

9. The relay detection apparatus in claim 6, wherein when a voltage difference between the first input detection voltage and the second input detection voltage is equal to a voltage difference between the first output detection voltage and the second output detection voltage, the voltage comparison unit is configured to compare that the first output voltage is equal to the second output voltage so that normal contact statuses of the input contacts, the output normally-open contacts, and the output normally-close contacts of the first relay and the second relay are detected out; when the voltage difference between the first input detection voltage and the second input detection voltage is not equal to the voltage difference between the first output detection voltage and the second output detection voltage, the voltage comparison unit is configured to compare that the first output voltage is not equal to the second output voltage so that abnormal contact statuses of the input contact, the output normally-open contact, and the output normally-close contact of the first relay or the second relay are detected out.

10. A relay detection apparatus operated in a three-phase AC power source, comprising:
at least one relay, comprising: an input contact; an output normally-open contact; and an output normally-close contact, wherein the output normally-open contact forms a normally-open path with the input contact, the output normally-close contact forms a normally-close contact with the input contact;
at least one voltage detection module, comprising:
a first voltage detection unit configured to receive a voltage at the input contact and produce a first output voltage; and
a second voltage detection unit configured to receive a voltage at the output normally-close contact and produce a second output voltage; and
at least one voltage comparison unit configured to receive the first output voltage and the second output voltage and compare the first output voltage and the second output voltage so that normal and abnormal contact statuses of the input contact, the output normally-open contact, and the output normally-close contact of the relay are detected out;
wherein when the three-phase AC power source is a three-phase four-wire power source, the number of the at least one relay is two, namely a first relay and a second relay; the first relay is connected to a first phase line path of the three-phase AC power source and the second relay is connected to a second phase line path of the three-phase AC power source; the number of the at least one voltage detection module is two, namely a first voltage detection module and a second voltage detection module, the first voltage detection unit of the first voltage detection module is configured to receive a voltage at the input contact of the first relay to be a first input detection voltage and receive a neutral voltage of a ground path of the single-phase AC power source to be a second input detection voltage, and produce the first output voltage; the second voltage detection unit of the first voltage detection module is configured to receive a voltage at the output normally-close contact of the first relay to be a first output detection voltage and receive the neutral voltage to be a second output detection voltage, and produce the second output voltage; the first voltage detection unit of the second voltage detection module is configured to receive a voltage at the input contact of the second relay to be a third input detection voltage and receive the neutral voltage to be a fourth input detection voltage, and produce the first output voltage; the second voltage detection unit of the second voltage detection module is configured to receive the voltage at the output normally-close contact of the second relay to be a third output detection voltage and receive the neutral voltage to be a fourth output detection voltage, and produce the second output voltage.

11. The relay detection apparatus in claim 10, wherein when a voltage difference between the first input detection voltage and the second input detection voltage is equal to a voltage difference between the first output detection voltage and the second output detection voltage, the voltage comparison unit is configured to compare that the first output voltage is equal to the second output voltage so that normal contact statuses of the input contact, the output normally-open contact, and the output normally-close contact of the first relay are detected out; when a voltage difference between the third input detection voltage and the fourth input detection voltage is equal to a voltage difference between the third output detection voltage and the fourth output detection voltage, the voltage comparison unit is configured to compare that the first output voltage is equal to the second output voltage so that normal contact statuses of the input contact, the output normally-open contact, and the output normally-close contact of the second relay are detected out; when the voltage difference between the first input detection voltage and the second input detection voltage is not equal to the voltage difference between the first output detection voltage and the second output detection voltage, the voltage comparison unit is configured to compare that the first output voltage is not equal to the second output voltage so that abnormal contact statuses of the input contact, the output normally-open contact, and the output normally-close contact of the first relay are detected out; when the voltage difference between the third input detection voltage and the fourth input detection voltage is not equal to the voltage difference between the third output detection voltage and the fourth output detection voltage, the voltage comparison unit is configured to compare that the first output voltage is not equal to the second output voltage so that abnormal contact statuses of the input contact, the output normally-open contact, and the output normally-close contact of the second relay are detected out.

12. The relay detection apparatus in claim 10, wherein the relay detection apparatus further comprises a third relay and the third relay is connected to a third phase line path of the three-phase AC power source; the number of the at least one voltage detection module is three, namely a first voltage detection module, a second voltage detection module, and a third voltage detection module, the first voltage detection unit of the first voltage detection module is configured to receive a voltage at the input contact of the first relay to be a first input detection voltage and receive a neutral voltage of a ground path of the single-phase AC power source to be a second input detection voltage, and produce the first output voltage; the second voltage detection unit of the first voltage detection module is configured to receive a voltage at the output normally-close contact of the first relay to be a first output detection voltage and receive the neutral voltage to be a second output detection voltage, and produce the second output voltage; the first voltage detection unit of the second voltage detection module is configured to receive a voltage at the input contact of the second relay to be a third input detection voltage and receive the neutral voltage to be a fourth input detection voltage, and produce the first output voltage; the second voltage detection unit of the second voltage detection module is configured to receive the voltage at the output normally-close contact of the second relay to be a third output detection voltage and receive the neutral voltage to be a fourth output detection voltage, and produce the second output voltage; the first voltage detection unit of the third voltage detection module is configured to receive a voltage at the input contact of the third relay to be a fifth input detection voltage and receive the neutral voltage to be a sixth input detection voltage, and produce the first output voltage; the second voltage detection unit of the third voltage detection module is configured to receive the voltage at the output normally-close contact of the second relay to be a fifth output detection voltage and receive the neutral voltage to be a sixth output detection voltage, and produce the second output voltage.

13. The relay detection apparatus in claim 12, wherein when a voltage difference between the first input detection voltage and the second input detection voltage is equal to a voltage difference between the first output detection voltage and the second output detection voltage, the voltage comparison unit is configured to compare that the first output voltage is equal to the second output voltage so that normal contact statuses of the input contact, the output normally-open contact, and the output normally-close contact of the first relay are detected out; when a voltage difference between the third input detection voltage and the fourth input detection voltage is equal to a voltage difference between the third output detection voltage and the fourth output detection voltage, the voltage comparison unit is configured to compare that the first output voltage is equal to the second output voltage so that normal contact statuses of the input contact, the output normally-open contact, and the output normally-close contact of the second relay are detected out; when a voltage difference between the fifth input detection voltage and the sixth input detection voltage is equal to a voltage difference between the fifth output detection voltage and the sixth output detection voltage, the voltage comparison unit is configured to compare that the first output voltage is equal to the second output voltage so that normal contact statuses of the input contact, the output normally-open contact, and the output normally-close contact of the third relay are detected out; when the voltage difference between the first input detection voltage and the second input detection voltage is not equal to the voltage difference between the first output detection voltage and the second output detection voltage, the voltage comparison unit is configured to compare that the first output voltage is not equal to the second output voltage so that abnormal contact statuses of the input contact, the output normally-open contact, and the output normally-close contact of the first relay are detected out; when the voltage difference between the third input detection voltage and the fourth input detection voltage is not equal to the voltage difference between the third output detection voltage and the fourth output detection voltage, the voltage comparison unit is configured to compare that the first output voltage is not equal to the second output voltage so that abnormal contact statuses of the input contact, the output normally-open contact, and the output normally-close contact of the second relay are detected out; when the voltage difference between the fifth input detection voltage and the sixth input detection voltage is not equal to the voltage difference between the fifth output detection voltage and the sixth output detection voltage, the voltage comparison unit is configured to compare that the first output voltage is not equal to the second output voltage so that abnormal contact statuses of the input contact, the output normally-open contact, and the output normally-close contact of the third relay are detected out.

14. A method of operating a relay detection apparatus, steps of the method comprising:
(a) providing at least one relay, each relay has an input contact, an output normally-open contact, and an output normally-close contact wherein the output normally-open contact forms a normally-open path with the input contact, the output normally-close contact forms a normally-close contact with the input contact;
(b) providing at least one voltage detection module; each voltage detection module has a first voltage detection unit and a second voltage detection unit; the first voltage detection unit is configured to receive a voltage at the input contact to be a first detection voltage and produce a first output voltage; the second voltage detection unit is configured to receive a voltage at the output normally-close contact to be a second detection voltage and produce a second output voltage; and
(c) providing at least one voltage comparison unit; the voltage comparison unit is configured to receive the first output voltage and the second output voltage and compare the first output voltage and the second output voltage so that normal and abnormal contact statuses of the input contact, the output normally-open contact, and the output normally-close contact of the relay are detected out;
wherein the number of the at least one relay is one, the relay is connected to a line path of the single-phase AC power source; the first voltage detection unit of the voltage detection module is configured to receive a voltage at the input contact of the relay to be a first input detection voltage and receive a voltage of a ground path of the single-phase AC power source to be a second input detection voltage, and produce the first output voltage; the second voltage detection unit of the voltage detection module is configured to receive the voltage at the output normally-close contact of the relay to be a first output detection voltage and receive the voltage of the ground path of the single-phase AC power source to be a second output detection voltage, and produce the second output voltage.

15. The method of operating the relay detection apparatus in claim 14, wherein the number of the at least one relay is two, namely a first relay and a second relay; the first relay is connected to a line path of a single-phase AC power source and the second relay is connected to a ground path of the single-phase AC power source; the first voltage detection unit of the voltage detection module is configured to receive the voltage at the input contact of the first relay to be a first input detection voltage and receive the voltage at the input contact of the second relay to be a second input detection voltage, and produce the first output voltage; the second voltage detection unit of the voltage detection module is configured to receive the voltage at the output normally-close contact of the first relay to be a first output detection voltage and receive the voltage at the output normally-close contact of the second relay to be a second output detection voltage, and produce the second output voltage.

16. The method of operating the relay detection apparatus in claim 15, wherein when a voltage difference between the first input detection voltage and the second input detection voltage is equal to a voltage difference between the first output detection voltage and the second output detection voltage, the voltage comparison unit is configured to compare that the first output voltage is equal to the second output voltage so that normal contact statuses of the input contacts, the output normally-open contacts, and the output normally-close contacts of the first relay and the second relay are detected out; when the voltage difference between the first input detection voltage and the second input detection voltage is not equal to the voltage difference between the first output detection voltage and the second output detection voltage, the voltage comparison unit is configured to compare that the first output voltage is not equal to the second output voltage so that abnormal contact statuses of the input contact, the output normally-open contact, and the output normally-close contact of the first relay or the second relay are detected out.

17. The method of operating the relay detection apparatus in claim 14, wherein when a voltage difference between the first input detection voltage and the second input detection voltage is equal to a voltage difference between the first output detection voltage and the second output detection voltage, the voltage comparison unit is configured to compare that the first output voltage is equal to the second output voltage so that normal contact statuses of the input contact, the output normally-open contact, and the output normally-close contact of the relay are detected out; when the voltage difference between the first input detection voltage and the second input detection voltage is not equal to the voltage difference between the first output detection voltage and the second output detection voltage, the voltage comparison unit is configured to compare that the first output voltage is not equal to the second output voltage so that abnormal contact statuses of the input contact, the output normally-open contact, and the output normally-close contact of the relay are detected out.

* * * * *